(12) United States Patent
Chien et al.

(10) Patent No.: US 9,530,813 B2
(45) Date of Patent: Dec. 27, 2016

(54) SEAL RING STRUCTURE WITH ROUNDED CORNERS FOR SEMICONDUCTOR DEVICES

(71) Applicant: Taiwan Semiconductor Manufacturing Co., Ltd., Hsin-Chu (TW)

(72) Inventors: Volume Chien, Tainan (TW); Yun-Wei Cheng, Taipei (TW); I-l Cheng, Tainan (TW); Shiu-Ko Jangjian, Tainan (TW); Chi-Cherng Jeng, Tainan (TW); Hsin-Chi Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 52 days.

(21) Appl. No.: 14/166,878

(22) Filed: Jan. 29, 2014

(65) Prior Publication Data

US 2014/0264710 A1    Sep. 18, 2014

Related U.S. Application Data

(60) Provisional application No. 61/780,154, filed on Mar. 13, 2013.

(51) Int. Cl.
*H01L 27/146*    (2006.01)
*H01L 23/00*    (2006.01)

(52) U.S. Cl.
CPC ......... *H01L 27/1464* (2013.01); *H01L 23/562* (2013.01); *H01L 27/14623* (2013.01); *H01L 2924/0002* (2013.01)

(58) Field of Classification Search
CPC combination set(s) only.
See application file for complete search history.

(56) References Cited

U.S. PATENT DOCUMENTS

2005/0179213 A1*  8/2005  Huang ................ H01L 23/562
                                                            277/620
2005/0263855 A1   12/2005  Fu et al.
2009/0023400 A1*  1/2009  Nishio ............................ 455/91
(Continued)

FOREIGN PATENT DOCUMENTS

CN    1783494 A    6/2006

OTHER PUBLICATIONS

Official Action issued Apr. 5, 2016 in counterpart Chinese patent application No. 2016033001864160.

*Primary Examiner* — Mohammad Islam
*Assistant Examiner* — Ratisha Mehta
(74) *Attorney, Agent, or Firm* — Duane Morris LLP (57) ABSTRACT

Seal ring structures are provided with rounded corner junctions or corner junctions that include polygons. The seal rings surround generally rectangular semiconductor devices such as integrated circuits, image sensors and other devices. The seal ring includes a configuration of two sets of generally parallel opposed sides and the corner junctions are the junctions at which adjacent orthogonal seal ring sides are joined. The seal rings are trench structures or filled trench structures in various embodiments. The rounded corner junctions are formed by a curved arc or multiple line segments joined together at various angles. The corner junctions that include one or more enclosed polygons include polygons with at least one polygon side being formed by one of the seal ring sides.

13 Claims, 4 Drawing Sheets

(56) References Cited

U.S. PATENT DOCUMENTS

| | | | |
|---|---|---|---|
| 2009/0079039 A1* | 3/2009 | Fujita | H01L 23/564 257/620 |
| 2011/0193198 A1* | 8/2011 | Chen | 257/619 |
| 2012/0175722 A1* | 7/2012 | Tai | H01L 27/14636 257/447 |
| 2012/0223445 A1* | 9/2012 | Lehr | H01L 23/544 257/797 |

* cited by examiner

SEAL RING STRUCTURE WITH ROUNDED CORNERS FOR SEMICONDUCTOR DEVICES

RELATED APPLICATION

This is a regular U.S. patent application that claims priority to U.S. provisional patent application Ser. No. 61/780,154 filed Mar. 13, 2013, the contents of which are herein incorporated by reference as if set forth in their entirety.

TECHNICAL FIELD

The disclosure relates, most generally, to semiconductor devices and image sensors and manufacturing methods therefore and more particularly to seal ring structures used in such devices.

BACKGROUND

Seal ring structures are commonly used to surround integrated circuit devices, image sensor devices including front and back-illuminated image sensor devices, and other semiconductor devices formed on a silicon or other semiconductor chip. The seal ring structures internally or externally surround the silicon or other semiconductor chip that includes the semiconductor device to isolate the semiconductor device and protect it from stress energy from other components. Stress energy in components external to the semiconductor chip could propagate to and destroy the semiconductor device on the semiconductor chip if not for the presence of the seal rings.

One example of a seal ring structure is a trench that extends around the periphery of the chip and another example is a trench that extends around the periphery of the semiconductor chip but is filled with a material different than the substrate material which is typically silicon or other suitable materials.

Semiconductor chips are manufactured on semiconductor substrates and have a rectangular shape. This rectangular shape enables the individual chips to be separated by dicing along straight lines in orthogonal directions. The dicing takes place along scribe lines between the chips. Because semiconductor chips are rectangular in shape and because seal rings extend around the semiconductor chips, seal rings are also rectangular in shape. At the corners of these rectangularly shaped seal rings are orthogonal corners. These right angle corners are susceptible to stress and charge concentration due to their shape and structure. The stress and charge concentration can cause the seal ring structure to fracture at such corners when exposed to stress and charge concentration. Any fracturing or voiding in the seal ring provides a path for external stresses and charges to reach the semiconductor chip itself. This can result in device destruction.

It would be desirable to provide seal ring structures that are immune to stress effects and localized charge concentration build up.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides seal ring structures usable in various semiconductor devices such as integrated circuits, image sensors including back-illuminated and front-illuminated image sensors and various other semiconductor devices. The seal rings generally surround the semiconductor device and extend around the periphery of the generally rectangular semiconductor chip upon which the semiconductor device is formed and which are separated by scribe lines. The seal ring structure is formed in the scribe line in some embodiments and inwardly adjacent the scribe lines in other embodiments. The various semiconductor devices and the chips upon which they are formed are generally rectangular in shape as are the seal rings that generally surround the semiconductor device. While the seal rings of the disclosure also include seal rings with multiple separated portions in some embodiments, most seal rings include sets of opposed generally parallel sides and adjacent sides that intersect at corner junctions. Even the seal ring embodiments in which the seal ring includes multiple separate portions include adjacent, generally orthogonal sides that are joined at corner junctions. The seal rings of the disclosure are characterized, however, by having corner junctions that are not simply right-angle corners formed by the intersection of the two substantially orthogonal, adjacent linear sides of the seal ring. Rather, the junctions between the adjacent sides of the seal rings of the various seal ring embodiments provided in the disclosure are characterized by the two generally orthogonal sides of the seal ring having a junction being a curved junction, a junction formed of a plurality of line segments connected at various junctions and/or one or more closed polygonal structures formed at the corner junctions.

Figure 1:
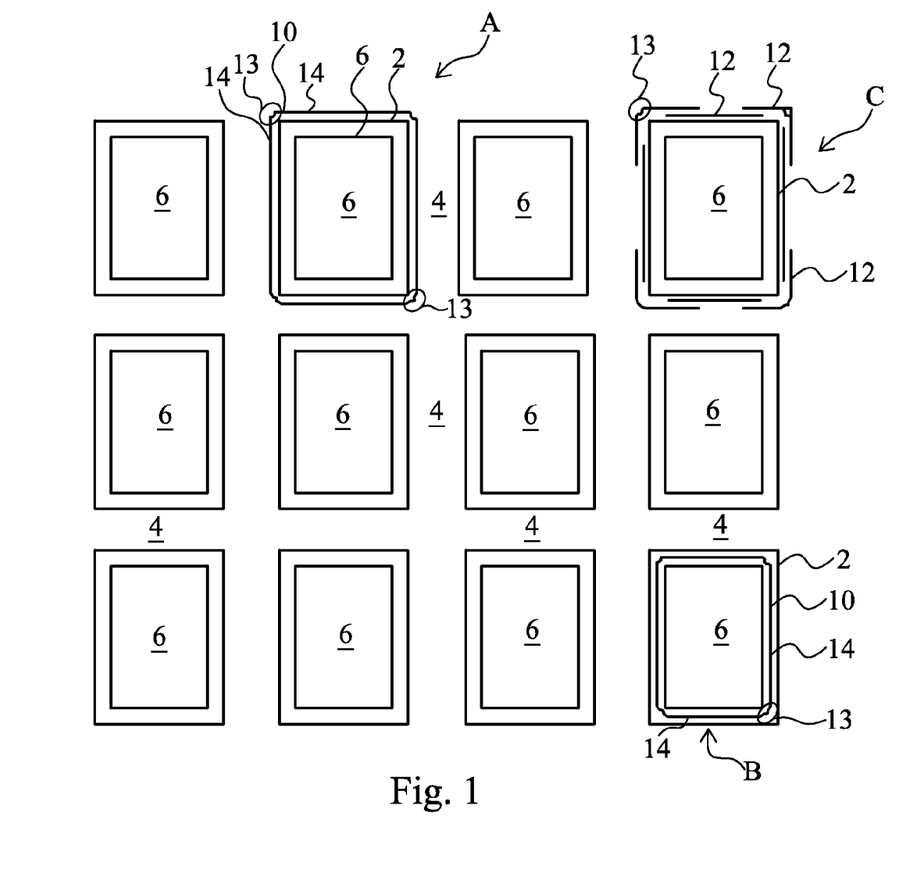
FIG. 1 is a plan view of a portion of a semiconductor substrate showing seal ring embodiments with respect to semiconductor devices, chips and scribe lines.

FIG. 1 is a plan view showing chips 2 that are generally rectangular and formed on a portion of a substrate and separated by scribe lines 4. Each chip 2 includes a semiconductor device 6 and is alternatively referred to as a die. Semiconductor device 6 occupies all or most of the area of chip 2 in various embodiments. Semiconductor device 6 is an integrated circuit or other semiconductor circuit in some embodiments and in other embodiments, semiconductor device 6 is an image sensor including a pixel array. In some embodiments, the image sensor chip is a front-illuminated image sensor with an array of image elements, i.e. pixels, and in other embodiments, the image sensor is a back-illuminated image sensor. A back-illuminated sensor, also known as backside illumination (BSI or BI) sensor, is a type of digital image sensor that uses an arrangement of imaging elements to increase the amount of light captured and thereby improve low-light performance. A back-illuminated image sensor device contains many of the same elements as a front-illuminated image sensor, but orients the wiring behind the photocathode layer by flipping the silicon substrate during manufacturing and then thinning its reverse side so that light can strike the photocathode layer without passing through the wiring layer. This change improves the efficiency of capturing input photons.

In one embodiment, the seal ring is a trench structure formed in a substrate or formed in the base material of chip 2. In another embodiment, the seal ring is a material structure formed of a material different than the material, e.g. silicon, of the chip surrounded by the seal ring.

Still referring to FIG. 1, chips 2 are generally rectangular and aligned in rows and columns and are of the same dimension. Scribe lines 4 extend between chips 2. Each chip 2 includes a semiconductor device 6. In embodiment "A," semiconductor device 6 is surrounded by seal ring 10 that completely surrounds semiconductor device 6 and chip 2, and is disposed within scribe lines 4. Although seal ring 10 includes two sets of opposed parallel sides and adjacent sides that are generally orthogonal to one another, each corner junction 13 is not simply a right-angle formed by the intersection of adjacent linear sides 14 of seal ring 10. In some embodiments as will be shown in subsequent figures, corner junction 13 includes a plurality of line segments joined together and in some embodiments as will also be shown in subsequent figures, corner junctions 13 include enclosed polygons. In other embodiments, corner junctions 13 are curved, rounded features. In some embodiments, corner junction 13 includes a plurality of line segments joined together to produce a rounding effect and also include enclosed polygons.

Corner junctions 13 can be generally described as a rounded junction with one or more arcuate portions in one embodiment. In some embodiments, the rounded nature is due to a number of short segments coupled together at multiple junctions to join adjacent sides 14 of seal ring 10, and produce the rounding. Stated alternatively, the outer perimeter (i.e. outer edge) of the seal ring at corner junction 13 includes multiple turning points. In another embodiment, corner junctions 13 include one or more polygon structures and according to each embodiment, the result is a smoother transition from one adjacent side 14 to another, thereby reducing stress and charge concentration by eliminating adjacent orthogonal sides 14 being coupled by a single right-angle coupling. In some embodiments, corner junctions 13 have both a generally rounded perimeter and include one or more enclosed or other polygon structures located at corner junctions 13.

In embodiment "B," chip 2 includes semiconductor device 6 and seal ring 10 surrounds semiconductor device 6, but lies within and not surrounding chip 2. Seal ring 10 extends substantially around semiconductor device 6 and includes a shape defined by two sets of opposed parallel sides and includes four corner junctions 13 at which adjacent sides 14 of seal ring 10 are joined. Each corner junction 13 represents a structure other than a single right-angle formed between generally perpendicular, adjacent sides 14 of seal ring 10.

In embodiment "C," chip 2 includes semiconductor device 6. In embodiment "C," however, seal ring 12 includes inner portions and outer portions that together completely surround semiconductor device 6 and chip 2. Each peripheral location of chip 2 and semiconductor device 6 includes at least one peripherally disposed portion of seal ring 12. In other embodiments, seal ring 12 includes two seal rings such as seal rings 10 and each completely surrounds chip 2. In yet another embodiment, one seal ring 10 is disposed around semiconductor device 6 and within chip 2 and a further seal ring such as seal ring 10 is disposed peripherally around chip 2 and in scribe line 4. Each corner junction 13 of seal ring 12 is as described above, i.e. not simply an orthogonal junction between two sides of seal ring 12. Further details of corner junctions 13 are shown in the subsequent figures.

Figure 2:
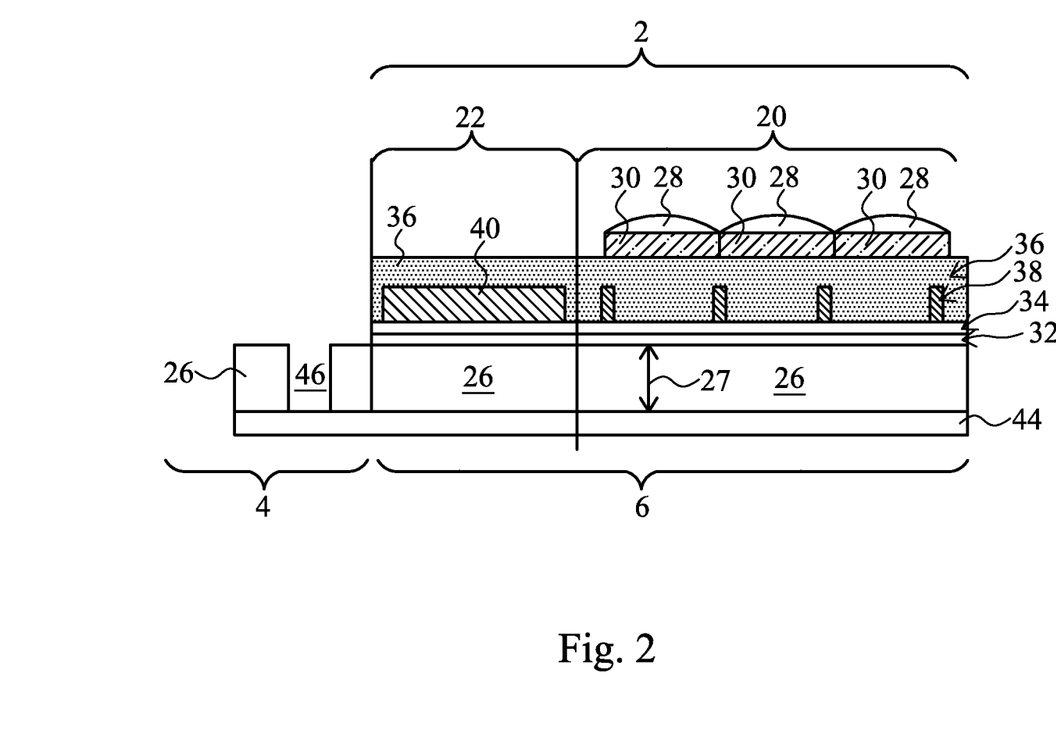
FIG. 2 is a cross-sectional view of an embodiment of an image sensor with a seal ring trench formed in a scribe line.

FIG. 2 is a cross-sectional view of one embodiment of a semiconductor device 6. FIG. 2 shows an embodiment in which semiconductor device 6 is a back-illuminated image sensor. The back-illuminated image sensor includes pixel array 20 and black level calibration portion 22 within chip 2. Semiconductor device 6 is formed in chip 2 on silicon 26 which also extends into scribe line 4. Silicon 26 is part of a silicon wafer, i.e. substrate in some embodiments and silicon 26 represents a layer formed over a semiconductor substrate but which now serves as the base layer for semiconductor device 6. Silicon 26 forms the base material of chip 2 in this embodiment, but materials other than silicon are used as the base material in other embodiments. Still referring to FIG. 2, pixel array 20 includes lenses 28 formed over respective pixels 30. Pixels 30 include red, green and blue color filters in some embodiments but other arrangements are used in other embodiments. In the illustrated embodiment, pixel array 20 includes ARC (anti-reflective coating) layer 32, buffer layer 34 and dielectric 36. Other layers of material and other arrangements are used in other embodiments. Within dielectric 36 are segments of metal grid 38 within pixel array 20 and metal shield 40 is in black level calibration portion 22. Silicon 26 is disposed over interlevel dielectric, ILD 44, which extends through semiconductor device 6 and scribe line 4. Other materials and other arrangements are used in other embodiments.

Within scribe line 4 is silicon 26 and trench 46 that extends down to ILD 44 in the illustrated embodiment. In some embodiments, the depth of trench 46 is as great as the thickness 27 of silicon 26, which represents the thickness of the base material of semiconductor device 6 and chip 2. In plan view, trench 46 extends completely or at least partially around chip 2 and semiconductor device 6 within scribe line 4 and serves as a seal ring. In other embodiments, trench 46 is filled with a different material than silicon 26 and extends completely or at least partially around chip 2 and semiconductor device 6, within scribe line 4 and serves as a seal ring. In some embodiments, the different material is a dielectric material but various other suitable material such as a polymer or air (i.e., trench 46 is unfilled) are used in other embodiments. In the illustrated embodiment, semiconductor device 6 and chip 2 appear to occupy the same real estate, but in other embodiments, semiconductor device 6 is formed within chip 2 and chip 2 includes a periphery buffer region that does not include semiconductor device 6.

Although described in conjunction with silicon 26 in FIG. 2, in other embodiments, chip 2 is formed of, and semiconductor device 6 is formed on other base materials such as silicon germanium or other materials used in semiconductor manufacturing.

Although semiconductor device 6 is an image sensor, particularly a back-illuminated image sensor shown with respect to scribe line 4 and trench 46 that forms a seal ring in the illustration of FIG. 2, semiconductor device 6 represents other image sensors or other semiconductor devices such as various integrated circuits, in other embodiments.

FIGS. 3A-3G represent embodiments of different corners, i.e. corner junctions 13 of FIG. 1. Each of embodiments 3A-3G represents a plan view of the corner junction, i.e. the location at which adjacent sides of the seal ring, are joined. FIGS. 3A-3G represent various types of seal rings, including but not limited to trenches and trenches filled with material other than the material of the semiconductor device, i.e. the chip 2. Although only one corner junction 13 is shown in each of FIGS. 3A-3G, each seal ring can include one, two, three or all four corners being any one of the rounded or polygonal corners shown in FIGS. 3A-3G or as described herein.

Figure 3A:
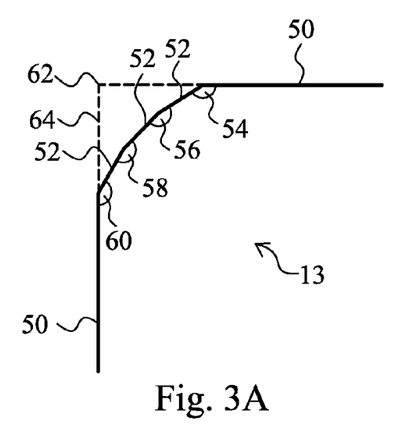
FIGS. 3A-3G are top views showing rounded corners of seal rings according to various embodiments of the disclosure.

FIG. 3A shows an embodiment in which adjacent and generally orthogonal sides 50 of a seal ring that at least partially surrounds a semiconductor device, are joined at a junction, i.e. corner junction 13. Sides 50 are each linear and are joined by three line segments 52 that are joined at corresponding junctions, and in the illustrated embodiment, angles 54, 56, 58, and 60 represent the angles formed at the junctions formed between line segments 52. Each line segment 52 is a straight line segment in this illustrated embodiment, but the arrangement of line segments 52 produce a rounding effect and form the perimeter of the seal ring. In contrast, it should be noted that sides 50 are not joined at point 62, which represents a 90°, i.e. right-angle, junction formed between adjacent sides 50 if they were continued, as indicated by dashed lines 64. Each of angles 54, 56, 58 and 60 are about the same in FIG. 3A but in other embodiments, line segments 52 are joined to one another at junctions having different angles. Each of line segments 52 has about the same length in the illustrated embodiment but include different lengths in other embodiments.

Figure 3B:
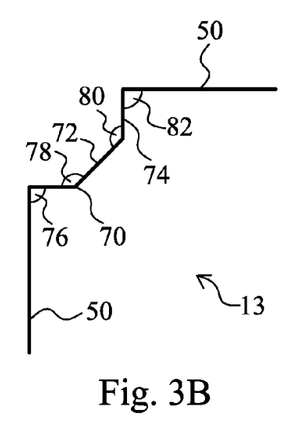

FIG. 3B shows another embodiment of a non-orthogonal corner junction 13 of a seal ring according to the disclosure. Sides 50 are joined together by three line segments 70, 72 and 74 which form the outer perimeter of the seal ring. The three line segments 70, 72, and 74 include different lengths and are joined to one another and to sides 50 at corresponding junctions. Angles 76, 78, 80 and 82 represent the angles formed at the junctions formed between line segments 70, 72 and 74 and sides 50. Angles 78 and 80 are obtuse angles formed at inwardly extending junctions. The arrangement produces a corner junction 13 that is not simply a corner representing the direct orthogonal coupling of adjacent linear sides 50.

Figure 3C:
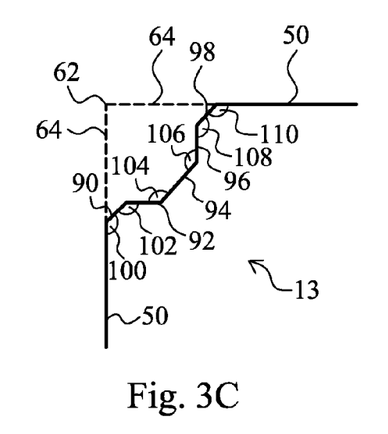

FIG. 3C shows sides 50 joined together by five line segments 90, 92, 94, 96, and 98 that form the outer perimeter of the seal ring at corner junction 13. Sides 50 are joined together by the five line segments that intersect at corresponding junctions and in the illustrated embodiment, angles 100, 102, 104, 106, 108 and 110 are formed at the corresponding junctions. Angles 100, 102, 108 and 110 are obtuse angles at outwardly extending junctions and angles 104, 106 are obtuse angles formed between line segments 92, 94 and 94, 96, respectively, at inwardly extending junctions. Dashed lines 64 and point 62 represent how sides 52 might be joined at right angles if not for the rounding provided by the disclosure.

The number of line segments joining sides 50, the length of line segments joining sides 50, the relative lengths of the line segments and the angles formed at the junctions between the line segments that join line sides 50 vary in various embodiments. In some embodiments, the outer periphery of corner junctions 13 is formed of a smooth, curved arc and not separate line segments.

Figure 3D:
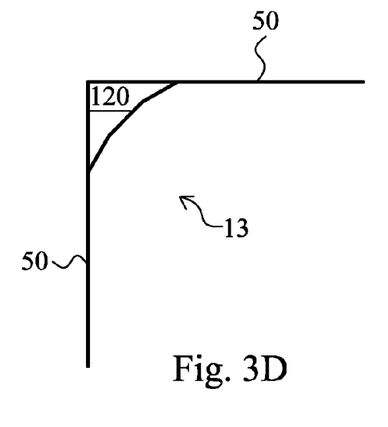
Figure 3E:
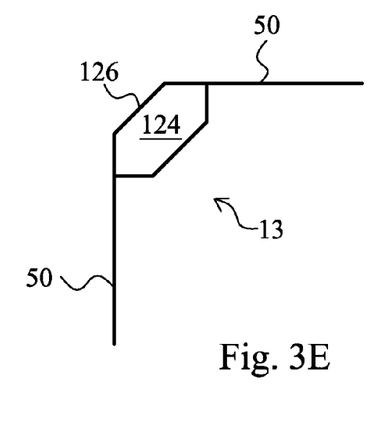
Figure 3F:
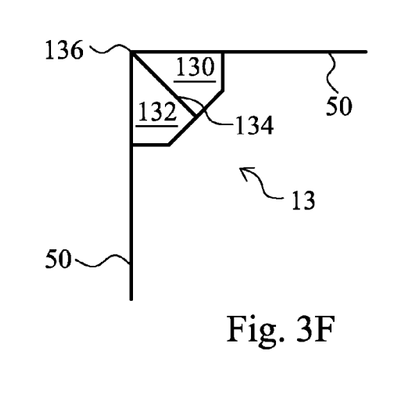

FIGS. 3D-3G show various other arrangements in which adjacent orthogonal sides 50 of a seal ring are not joined together in a corner that includes only sides 50 joined at right angles. FIG. 3D shows enclosed five-sided polygon 120 disposed at corner junction 13. Sides 50 of the seal ring form two of the sides of five-sided polygon 120. FIG. 3E shows six-sided polygon 124 formed at the junction between sides 50, i.e. at corner junction 13. The enclosed six-sided polygon 124 includes two sides formed of sides 50 of the seal ring. Line segment 126 joins sides 50 and produces a rounding effect in this embodiment that includes polygon 124. FIG. 3F shows an embodiment including two enclosed polygons. Enclosed polygons 130, 132 are mirror images of each other and are symmetrical about line segment 134 in the illustrated embodiment but other arrangements are used in other embodiments. Each enclosed polygon 130, 132 is a four-sided polygon and four-sided polygons 130, 132 share one side—common line segment 134. Even though sides 50 of the seal ring are joined at point 136 and do form a right-angle at point 136, there are additional line segments present at various angles to form enclosed polygons 130, 132 and sides 50 are not joined at a corner that includes only sides 50 intersecting one another at right angles. In other embodiments, one or more enclosed polygons are present at corner junction 13 and the polygons include various trapezoids, triangles, hexagons or other polygons in various embodiments.

Figure 3G:
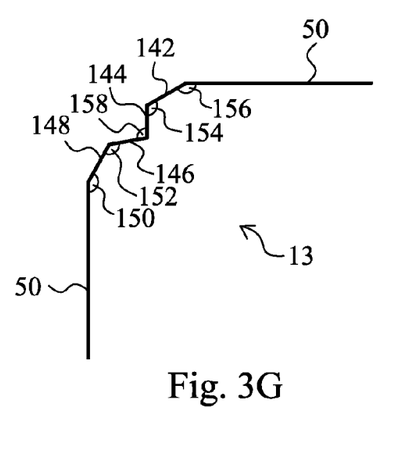

FIG. 3G shows four line segments 142, 144, 146 and 148 joining sides 50 of a seal ring at corner junction 13. Line segments 142, 144, 146 and 148 are joined at corresponding junctions and in the illustrated embodiment, angles 150, 152, 154, 156 and 158 represent the angles formed at the junctions formed between line segments 142, 144, 146 and 148 and sides 50. Angles 150, 152, 154 and 156 are each obtuse angles formed at junctions between outwardly extending junctions and angle 158 is an obtuse angle formed at a junction between and inwardly extending junction formed between line segments 144 and 146.

Although various arrangements are used in various embodiments, in many embodiments, the rounding of the perimeter of the seal ring at corner junctions 13 is attributable to the arrangement in which the individual line segments are coupled at obtuse angles, i.e. angles between 90° and 180°.

According to one aspect of the disclosure, a structure comprises: a semiconductor device disposed on a substrate; and a seal ring at least partially surrounding a die including the semiconductor device, the seal ring being generally rectangular in shape having at least one corner junction between orthogonal sides of the rectangle, in which an outermost edge of the corner forms a non-right angle with the orthogonal sides.

In some embodiments, the seal ring completely surrounds the die and each corner junction of the at least one corner junction of the seal ring, includes an outermost edge that is a non-right angle.

In some embodiments, the at least one corner junction includes a plurality of straight line segments that join the orthogonal sides of the seal ring.

In some embodiments, adjacent ones of the plurality of straight line segments are joined to one another at junctions comprising obtuse angle junctions.

In some embodiments, each corner junction of the at least one corner junction of the seal ring comprises a non-right angle junction.

In some embodiments, the plurality of straight line segments are joined to one another at junctions each comprising an obtuse angle.

In some embodiments, adjacent ones of the plurality of straight line segments are joined to one another at junctions and wherein at least one the junction is an inwardly extending first junction forming an obtuse angle and wherein at least one the junction is an outwardly extending second junction.

In some embodiments, the outwardly extending second junction forms an obtuse angle.

In some embodiments, the plurality of straight line segments form an outer perimeter of the corner junction and at least one of the line segments forms a side of an enclosed polygon disposed at the corner junction.

In some embodiments, each the corner junction is a curve.

In some embodiments, the seal ring is a trench structure that extends into the substrate.

In some embodiments, the substrate is formed of a first material and the seal ring is formed of a second material.

In some embodiments, the semiconductor device comprises an image sensor.

According to another aspect of the disclosure, a structure comprises: a semiconductor device disposed on a semiconductor substrate, a seal ring surrounding the semiconductor device, the seal ring being a trench structure extending into the substrate and having a configuration of two sets of opposed parallel lines forming sides of the seal ring and joined together at corner junctions, wherein at least one corner junction includes at least one enclosed polygon as part thereof, the enclosed polygon having at least one polygon side formed of one of the sides.

In some embodiments, a first corner junction of the corner junctions joins a first side of the sides to a second side of the sides, the first and second sides being generally orthogonal, and at least one of the at least one enclosed polygon includes at least one polygon side that extends to an end of the first side.

In some embodiments, the seal ring surrounds a die that includes the semiconductor device and at least a first corner junction of the corner junctions comprises plurality of straight line segments that join a first side of the sides to a second side of the sides and form a perimeter of the seal ring.

In some embodiments, the first corner junction includes at least one polygon having a polygon side formed by one of the line segments.

According to another aspect of the disclosure, a structure comprises: an image sensor found on a die that forms part of a semiconductor substrate; and a seal ring surrounding the image sensor, the seal ring having a generally rectangular shape with four sides, adjacent sides of the four sides being generally orthogonal and joined together at corner junctions, each corner junction having a periphery wherein the adjacent sides are joined at a non-right angle.

In some embodiments, the image sensor is a back-illuminated image sensor and each corner junction includes a plurality of line segments joined to one another.

In some embodiments, the line segments are joined together at junctions and each of the junctions comprises an obtuse angle junction.

In some embodiments, at least one of the junctions comprises an inwardly extending junction and at least one of the junctions comprises an outwardly extending junction and wherein the corner junction further includes at least one polygon having a polygon side formed by one of the line segments.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A structure comprising:
   a semiconductor device disposed on a substrate; and
   a seal ring at least partially surrounding said semiconductor device,
   said seal ring being generally rectangular in shape having at least one corner junction between orthogonal sides of the rectangle, in which an outermost edge of the corner forms a non-right angle with the orthogonal sides, said at least one corner junction including a plurality of straight line segments that join said orthogonal sides, wherein each of said plurality of straight line segments is not collinear with any of said orthogonal sides, the plurality of straight line segments form a single continuous path between said orthogonal sides, and adjacent ones of said plurality of straight line segments are joined to one another at junctions, at least one said junction forming a first obtuse angle facing away from said device, at least one said junction forming a second obtuse angle facing toward said device.

2. The structure as in claim 1, wherein said seal ring completely surrounds a die.

3. The structure as in claim 2, wherein each corner junction of said at least one corner junction of said seal ring comprises a non-right angle junction.

4. The structure as in claim 1, wherein said plurality of straight line segments form an outer perimeter of said corner junction and at least one of said line segments forms a side of an enclosed polygon disposed at said corner junction.

5. The structure as in claim 1, wherein said seal ring is a trench structure that extends into said substrate.

6. The structure as in claim 1, wherein said substrate is formed of a first material and said seal ring is formed of a second material.

7. The structure as in claim 1, wherein said semiconductor device comprises an image sensor.

8. A structure comprising:
    a semiconductor device disposed on a semiconductor substrate,
    a seal ring surrounding said semiconductor device,
    said seal ring being a trench structure extending into said substrate and including two sets of opposed parallel lines forming first, second, third, and fourth seal ring sides joined together at respective ones of a plurality of corner junctions, wherein a first corner junction of said plurality of corner junctions joins said first seal ring side to said second seal ring side, said first and second seal ring sides being orthogonal, said first corner junction including at least one enclosed polygon as part thereof, said enclosed polygon having a plurality of polygon sides including first and second polygon sides, said first polygon side formed of said first or second seal ring sides;
    wherein said second polygon side is not collinear with said first or second seal ring sides and extends to a common endpoint of said first and second seal ring sides.

9. The structure as in claim 8, wherein said seal ring surrounds a die that includes said semiconductor device and said first corner junction comprises a plurality of straight line segments that join said first seal ring side to said second seal ring side.

10. The structure as in claim 9, wherein said first corner junction includes at least one said polygon having a polygon side formed by one of said line segments.

11. A structure comprising:
    semiconductor device disposed on a substrate; and
    a seal ring at least partially surrounding said semiconductor device,
    said seal ring having a generally rectangular shape with four sides, adjacent sides of said four sides being generally orthogonal and joined together at corner junctions, wherein said adjacent sides are joined at a non-right angle, each corner junction including a plurality of line segments joined to one another, wherein each of said plurality of line segments is not collinear with any of the adjacent sides corresponding to said corner junction, the plurality of line segments form a single continuous path between the adjacent sides corresponding to said corner junction, and adjacent ones of said plurality of line segments are joined to one another at junctions, at least one said junction extending inwardly toward said device, the plurality of straight line segments including first, second, and third straight line segments, the first and second straight line segments forming a first obtuse angle, the second and third straight line segments forming a second obtuse angle, the first and third straight line segments intersecting respective adjacent ones of said generally orthogonal sides.

12. The structure as in claim 11, wherein said semiconductor device includes an image sensor.

13. The structure as in claim 11 wherein said corner junction further includes at least one polygon having a polygon side formed by one of said line segments.

\* \* \* \* \*